United States Patent [19]

Luo

[11] 4,331,758
[45] May 25, 1982

[54] PROCESS FOR THE PREPARATION OF LARGE AREA TFT ARRAYS

[75] Inventor: Fang C. Luo, Pittsford, N.Y.

[73] Assignee: Xerox Corporation, Stamford, Conn.

[21] Appl. No.: 203,219

[22] Filed: Nov. 3, 1980

[51] Int. Cl.³ .......................... C03C 5/00; G03C 11/00
[52] U.S. Cl. ........................................ 430/313; 29/571;
    29/580; 204/192 E; 156/643; 156/649;
    156/656; 156/657; 427/99; 430/314; 430/316;
    430/317
[58] Field of Search ............... 430/313, 314, 316, 317;
    204/192 E; 29/571, 580; 427/99; 156/643, 649,
    656, 657

[56] References Cited

U.S. PATENT DOCUMENTS

| 3,669,661 | 6/1972 | Page et al. |
|-----------|--------|------------|
| 4,013,502 | 3/1977 | Staples ............................ 156/608 |
| 4,040,073 | 8/1977 | Luo . |
| 4,042,854 | 8/1977 | Luo . |
| 4,086,127 | 8/1977 | Cresswell . |

Primary Examiner—Jack P. Brammer

[57] ABSTRACT

Thin film transistor arrays are prepared by a vacuum deposition technique wherein only a single deposition of discrete areas of an insulating material are deposited through a mask. No registration is required to form the various elements of the transistors. A unique structure is described wherein the contact of the semiconductor material with the source electrode, the source bus conductors, and the drain electrode is coterminous with conductive material forming the source electrode and bus conductors and the drain electrode.

6 Claims, 10 Drawing Figures

PROCESS FOR THE PREPARATION OF LARGE AREA TFT ARRAYS

BACKGROUND OF THE INVENTION

This invention relates to thin film transistors, thin film transistor arrays and to a method of preparing the same.

It has been known heretofore to utilize thin film transistors and particularly an array of thin film transistors to control and drive display panels such as, for example, liquid crystal displays, electroluminescent mediums, and the like. Thin film transistors in this application offer an attractive substitute to the utilization of silicon technology because of the size limitation problems associated with that technology. A large number of thin film transistors can be prepared within any given size area in a density satisfactory for pictorial presentation. Examples of thin film transistors and associated display panels are set forth in U.S. Pat. Nos. 4,040,073 and 4,042,854.

Fabrication of thin film transistor arrays requires the generation of well-defined geometric patterns of metals, semiconductors and insulators. These are deposited in layers to form the transistor structures and circuit interconnections. Patterns can be generated by shadow masking or photolithographic methods. The first, a popular classic method, relies on a series of mechanical masks to define pattern geometries while shielding the remainder of the substrate from the deposition source. The photolithographic method is attractive for cost effective fabrication of large area circuits containing a high density of components.

It is known by those working in the field of thin film transistors that devices having more suitable characteristics are prepared when the interfaces between the various layers of the thin film transistors are prepared in a single vacuum pump-down. This is especially true of the layers which form the interface with the semiconductive layer of the thin film transistor. It is thought that the reason for this is that a freshly prepared clean surface, when forming the interface with the semiconductive layer, is desirable without being initially subjected to ambient conditions which may result in impurities or some form of degradation occurring to the surface structure. Thus, it is impossible to achieve a thin film transistor by the single pump-down technique where photolithographic techniques are employed in the fabrication of the layers next adjacent to the semiconductive layer. In the past, single pump-down techniques have been employed wherein a multiple number of shadow masks are employed within the vacuum system in order to deposit the proper shape of the different components of the thin film transistor during the single pump-down. This creates many problems because the multiple use of shadow masks has built-in limitations such as high initial capital expenditure, low ultimate panel size, and low resolution of the product, for example. Further, when one shadow mask is moved out of position between the substrate and the source of the material being deposited and a second moved in place, a registration problem employing very close tolerances is present. When it is considered that in a thin film transistor array at least 2500 thin film tansistors are prepared per square inch of area, this registration problem is thereby greatly magnified.

It is therefore an object of this invention to provide a method of preparing thin film transistor arrays wherein the various layers are fabricated by a single pump-down technique without the use of multiple shadow mask steps.

PRIOR ART STATEMENT

F. C. Luo: U.S. Pat. No. 4,040,073—Aug. 2, 1977
F. C. Luo: U.S. Pat. No. 4,042,854—Aug. 16, 1977
M. W. Cresswell: U.S. Pat. No. 4,086,127—Aug. 25, 1978
D. J. Page et al: U.S. Pat. No. 3,669,661—June 13, 1972

Luo U.S. Pat. No. 4,040,073—A double gated thin film field effect transistor in which cadmium selenide is the semiconductor material. A thin layer of indium is provided on either side of the cadmium selenide conducting channel and after annealing enhances the transconductance of the device and reduces trapping of charge in the semiconductor. The source and drain contacts of the device are a combination of an indium layer and a copper layer which improve the performance of the device.

Luo U.S. Pat. No. 4,042,854—A large area integrated solid-state flat panel display is detailed in which thin film transisor addressing and drive circuitry is provided at each individual picture point with a display medium. The preferred display medium is an electroluminescent phosphor layer. An insulating layer of laminated photoresist is disposed over all electrical circuit elements except the electroluminescent drive electrodes.

M. W. Cresswell U.S. Pat. No. 4,086,127—An improved method of fabricating apertured deposition masks is dislosed, with the masks being used in the fabrication of thin film deposited electronic components such as transistors. The masks comprise a core portion with a metal layer provided on a relief side of the core and a metal layer provided on the defining side of the core. The relief side metal layer and the core of the mask are further resist delineated, selectively plated and etched differentially providing a mask preform in which which the defining side metal layer is left intact. A narrow width radiation beam is then directed upon closely spaced portions of the defining side metal layer to selectively cut through the defining side metal layer providing the desired space apertures separated by a narrow bridge portion of the defining side metal layer.

Page et al U.S. Pat. No. 3,669,661—A process for producing a thin film transistor comprising, disposing a layer of a spacer material on one surface of a substrate, disposing a layer of a metal on said layer of spacing material, coating at least a portion of said metal layer with a layer of a photoresist material, exposing a pattern on said layer of photoresist material, developing said pattern on said layer of photoresist material, etching said pattern through to said one surface of the substrate, disposing said substrate in a vacuum chamber and sequentially vacuum depositing a plurality of materials through said etched pattern onto said surface of the substrate.

SUMMARY OF THE INVENTION

Accordingly, the invention contemplates a method of preparing an array of thin film transistors by depositing onto a substrate in a single pump-down, a uniform layer of a semiconducting material, depositing onto the semiconducting layer through a shadow mask a plurality of discrete areas of an insulating material, depositing a uniform layer of a conducting material over the areas of insulating material and exposed portions of the semiconducting layer, removing the substrate from vacuum, photolithographically forming a masking layer on the uniform layer of conducting material so that a predetermined pattern of openings are present therein, removing the portions of the conducting material and the semiconducting material unprotected by the masking layer to thereby form the source, drain and source-bus conductors of the array, removing the masking layer, depositing a uniform layer of insulating material over the thus-formed structure, and depositing in discrete areas a pattern of conductive material to form the gate and gate-bus conductors of the array.

Thus, the invention contemplates depositing a semiconductive layer, discrete areas of an insulating material and a conducting layer over the insulating material and semiconductive layer in a single vacuum pumpdown. This structure is then removed from vacuum and further processed in order to achieve a thin film transistor. Since only a single application of the insulating material is accomplished by deposition through a shadow mask, no registration problems are encountered. Further, the insulating material deposited through the shadow mask not only defines the conducting channel of the thin film transistor but protects the semiconductive material immediately adjacent thereto during the subsequent etching step of the subsequent photolithographic procedure.

Additionally, the invention contemplates a thin film transistor array wherein the contact area of the semiconductive conductive channel is coterminous with the source electrode, the source bus conductor and the drain electrode.

BRIEF DESCRIPTION OF THE DRAWINGS

Other objects and advantages of the present invention will become apparent from the following description with reference to the accompanying drawings, in which:

FIGS. 4–8A schematically represent the configuration of the device throughout the various steps of the procedure in accordance with this invention wherein FIG. 6A and FIG. 8A are sections taken along the lines 6A—6A and 8A—8A of FIG. 6 and FIG. 8, respectively;

FIG. 7 represents a cross-sectional view of a second embodiment in accordance with this invention at the point in the process after deposition of the uniform semiconductive layer in the vacuum chamber.

DETAILED DESCRIPTION OF THE INVENTION

Figure 1:
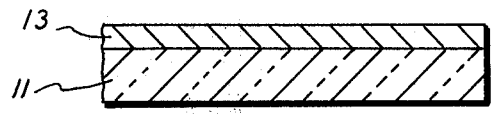
FIG. 1 is a cross-sectional view of a substrate being processed in accordance with one embodiment of this invention.

For a general understanding of the invention, reference is had to the drawings in which like reference characters have been used throughout to indicate like parts. FIG. 1 represents a substrate 11 such as, for example, insulating materials including glass, ceramics, plastic materials such as polymethylmethacrylate, polyesters, polycarbonates, polyvinyl polymers, and the like. Further, the substrate in certain instances may be fabricated of metal materials such as aluminum, copper, tin, chromium, or other conducting metallic materials. However, when a conducting material is used as the substrate, it is necessary for the operation of the device to cover the surface thereof initially with an insulating material.

Referring specifically to FIG. 1, the substrate 11 is carefully cleaned by suitable techniques known in the art, such as degreasing, washing, rinsing, and the like, and inserted into a vacuum chamber equipped with a means for moving shadow masks in and out of position between the source of the material to be deposited and the substrate. Equipment such as this is known in the art and requires no further explanation here. Any suitable means of applying the various films throughout this procedure in the vacuum may be employed such as, for example, evaporation, sputtering, and the like.

The vacuum chamber is then pumped down to a pressure of less than $10^{-5}$ torr and preferably less than $10^{-7}$ torr and the semiconductor layer 13 is deposited onto the substrate 11.

Figure 2:
FIG. 2 is a cross-sectional view of a substrate being processed in accordance with a second embodiment of this invention.

With regard to the embodiment shown in FIG. 1, it should be noted that the semiconductor layer 13 is deposited directly onto an insulating material. Precautions may be taken to prepare the surface of the substrate 11 prior to deposition of the semiconductor layer such as, for example, plasma etching, ion milling and the like, in order to provide a new surface onto which the semiconductor layer 13 is deposited. Further, the surface of the substrate 11 may initially have deposited thereon a uniform layer 15 of an insulating material such as, for example, aluminum oxide, silicon monoxide, silicon dioxide, calcium fluoride, magnesium fluoride, and the like. In this embodiment, the substrate may be either an insulating material or a conductive material. This structure is shown in FIG. 2 wherein substrate 11 has deposited thereon a uniform insulating layer 15, and layer 15 has deposited thereon a uniform layer of any suitable semiconducting material such as, for example, cadmium selenide, tellurium, cadmium sulfide, silicon, indium arsenide, gallium arsenide, tin oxide, lead telluride, and the like. It is pointed out herein that throughout the various embodiments described herein that the semiconducting layer may be any of the suitable semiconducting layers known in the thin film transistor art.

Figure 3:
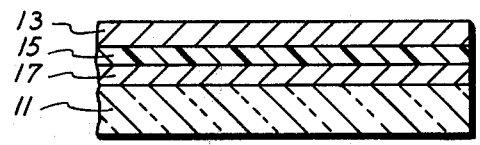
FIG. 3 is a cross-sectional view of a substrate being processed in accordance with a third embodiment of this invention.

In still another embodiment shown in FIG. 3, substrate 11 has initially deposited thereon a uniform conductive layer 17 which has deposited thereon an insulating layer 15 and a semiconducting layer 13.

In the embodiment shown in FIGS. 2 and 3, the semiconducting layer is always deposited upon a new surface in the vacuum. Thus, no impurities can be present because of the surface being subjected to ambient conditions. It is known that such surfaces are instrumental in the fabrication of thin film transistors having superior characteristics and, therefore, this structure is preferred herein. Additionally, this structure provides an inherent advantage in that it permits the ready adaptation of the device to also include a capacitor within each of the thin film transistor circuits fabricated.

In the remainder of the discussion herein, it should be understood that any of the structured of FIGS. 1 through 3 are contemplated as representative of the appearance of the structure at this point in the process in accordance with this invention. That is, the semiconductor material 13 may be deposited directly onto the substrate 11 onto an insulating layer 15 which separates the semiconductor 13 from the substrate 11 or onto an insulating layer 15 which separates the semiconductor layer 13 from a conductive layer 17 deposited onto the substrate 11.

Figure 4:
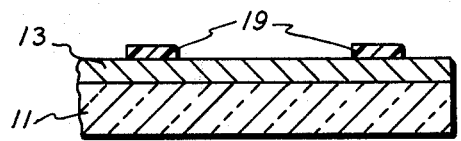

Referring to FIG. 4, subsequent to the deposition of the semiconductive layer 13, a shadow mask is positioned beneath the substrate 11 containing the uniform layer of semiconducting material 13 and a thin layer of an insulating material is deposited onto the surface of the semiconductive layer through the apertures of the shadow mask to form a plurality of discrete areas of insulating material 19 on the surface of the uniform layer of semiconducting material, as shown in FIG. 4. The discrete areas of insulating material are deposited generally in a thickness of from about 200 to about 2,000 Angstroms and preferably from about 500 to about 1000 Angstroms thickness. The apertures in the mask and thus the discrete areas of insulating material define the conducting channels of the completed thin film transistors of the array. Any suitable insulating material may be deposited, such as any of those mentioned above.

An example of a suitable shadow mask for the depositon of 2500 discrete rectangular-shaped areas of insulating material per square inch is a mask having 50 rows and 50 columns of rectangular openings 25 microns high and 63.5 microns wide, which rectangular areas are separated from each other by 508 microns center-to-center. Thus, such a mask will form an array of 2500 insulating areas per square inch, there being 50 insulating areas in each column and 50 insulating areas in each row.

Figure 5:
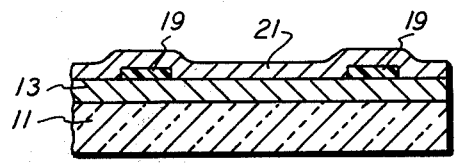

Following the deposition of the discrete areas of insulating material 19, a uniform layer of conductive material 21, shown in FIG. 5, such as, for example, aluminum, copper, gold, silver, chromium, indium, nickel, a combination of any of these materials such as, for example, a chromium-gold-indium composition or a number of layers of the conductive material such as, for example, an initial layer of indium overcoated with a gold layer is deposited.

The structure of FIG. 5 is next removed from the vacuum. A photolithographic technique is employed in order to delineate the configuration of the source and drain and bus bar patterns to be formed from the conducting layer 19. In this regard, kindly note FIG. 6 wherein the metal layer 21 is removed from all areas of the array except those defined by the source bus 23 and the drain pads 25. Thus, in practice, a photoresist is applied uniformly over the surface of the structure of FIG. 5. This can be accomplished by spin coating, doctor blading, or any suitable technique known in the photoresist art. The photoresist material is then exposed photographically to render certain portions thereof soluble and others insoluble in a given solvent. The source-drain photomask is aligned with the insulating pads 19 to insure proper position of the source and drain electrodes. In the case shown in FIGS. 6 and 6A, the areas of photoresist immediately covering the source bus 23 and the drain pads 25 will remain in place and all of the rest of the photoresist material will be removed. A suitable etching solution will then be employed to remove the unprotected conductive layer 21 and also the semiconductive layer 13 immediately beneath that portion of the conductive material that is being removed. It may be necessary to utilize a different etch for the semiconductive material than that for the conductive material, depending on the particular materials employed. In this regard, kindly note that the areas of the conductive material 21 immediately above the insulating pads 19 are etched away, but the insulating pads 19 protect the semiconductive material 13 immediately therebeneath thus forming the conductive channel between the source buses 23 and their corresponding drain pads 25. A suitable photoresist material for this process is Shipley AZ 1350 J sold by Shipley, Co., Inc., Newton, Mass. Finally, the remainder of the photoresist protecting the metal forming the source buses 23 and drain pads 25 is removed. The structure now has the configuration shown in FIGS. 6 and 6A.

Figure 6:
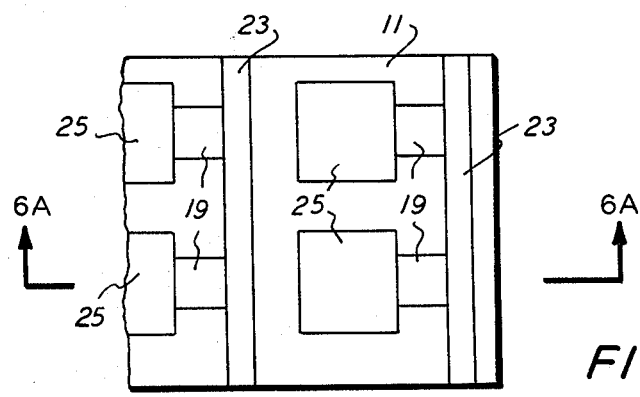
Figure 6A:
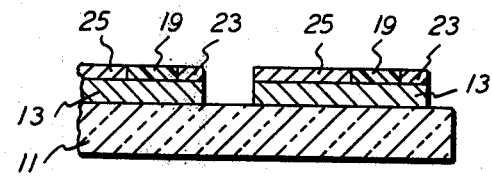
Figure 7:
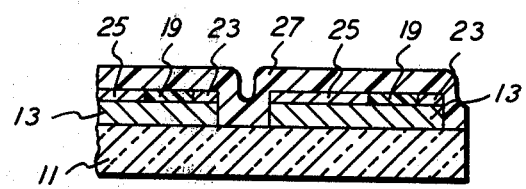

The next step in the procedure towards the completion of the thin film transistor array and shown in FIG. 7 is the deposition of a uniform insulating layer 27 over the structure of FIGS. 6 and 6A which forms the gate insulator of the thin film transistors. This can be accomplished by any suitable technique known in this art for the deposition of an insulating layer including once again placing the substrate containing the layers previously formed, as described above, into a suitable vacuum device and applying a uniform layer of a suitable insulator such as those mentioned above, for example, by evaporation or sputtering. During this pump-down, a uniform layer of a suitable conducting material is deposited over the insulating layer 27. The assembly may then be removed from the vacuum and the gates 29 and gate buses 31, see FIGS. 8 and 8A, fabricated by a photolithographic technique such as that described above with regard to the fabrication of the source buses 23 and drain pads 25.

Thus, the process described for the preparation of a thin film transistor array is advantageous for the reason that all of the interfaces between the semiconductor and the next adjacent layers and between the source and drain contacts are deposited in a single vacuum pump-down and, therefore, the characteristics of thin film transistors prepared by this one-pump-down technique is preserved. Secondly, as there is only one layer of material deposited through one patterned aperture mask, there is no requirement for mask registration inside the vacuum system. This enables the use of a simple vacuum system to accomplish the preparation.

Finally, it may be desirable to anneal the completed TFT structure, such as by heating in a non-oxidizing atmosphere such as nitrogen for about 10 hours at about 350° C.

In a preferred process in accordance with this invention, a glass substrate is positioned in a vacuum device and a conductive layer 17, such as that shown in FIG. 3, the conductive material being a 1000 Angstrom thick aluminum layer, is deposited thereon. Following the deposition of the aluminum layer, a 4000 Angstrom thick aluminum oxide ($Al_2O_3$) layer is uniformly deposited over the aluminum layer. This layer is shown as layer 15 in FIG. 3. Once again, in accordance with that depicted in FIG. 3, a uniform layer of about 100 Angstroms thick of cadmium selenide is uniformly deposited over the aluminum oxide layer. A mask having 50 apertures per linear inch is moved into position beneath the surface of the cadmium selenide semiconductive layer 13 and a layer of from about 500 to 1000 Angstroms thick of aluminum oxide is evaporated through the apertures in the mask to form the discrete areas shown as 19 in FIGS. 4 through 8A. The shadow mask is removed from its position beneath the semiconductive layer 13 and a uniform layer of 100 Angstroms thick of indium followed by a 1000 Angstroms thick gold layer is deposited over the entire surface of the assembly. This assembly is then removed from the vacuum system and a layer of Shipley AZ 1350 J photoresist is spin coated over the surface thereof. This photoresist is then exposed through a mask which delineates the areas to be removed from the conductive layer 21. The particular resist utilized herein is chemically altered in order that it is readily removed in exposed regions by treatment with aqueous solutions. The unwanted areas of the photoresist are then washed away leaving the areas, which are designated 23 and 25 in FIG. 6, covered with a resist material. A suitable etch for the conductive layer, that is, the indium and gold layers is then applied. A particularly suitable solution is about 3 parts HCl and about 1 part $HNO_3$. Further, the exposed regions of the semiconductive layer 13 are also etched away at the same time. The resist material immediately above the source and drain pads is now removed by application of acetone. The assembly thus produced is once again inserted into a vacuum and a 3,000 Angstroms thick aluminum oxide layer 27 is uniformly coated thereon. Following the application of the aluminum oxide layer, the gate electrodes 29 and gate buses 31 are applied by evaporation of a 1,000 Angstroms thick uniform aluminum layer over the surface of the insulating layer 27. The assembly is then removed from the vacuum and utilizing a similar photolithographic technique, the gates 29 and the gate buses 31 are delineated. Finally, windows through the $Al_2O_3$ layer 27 to expose the drain pads are etched.

It is, of course, to be understood that the particular steps with respect to the preparation of the final layers, as set forth in the specific example immediately above, are for exemplary purposes and that these layers may be formed by other suitable techniques of, for example, the gates and gate bus bars 31 may be formed by evaporation through a shadow mask directly onto the surface of the insulating layer 27 while within the same vacuum pump-down. Also, the insulating layer 27 may be fabricated of a suitable resinous material prior to the vacuum pump-down. Other similar techniques known in the art for the deposition will become apparent to one skilled in this art.

Figure 8:
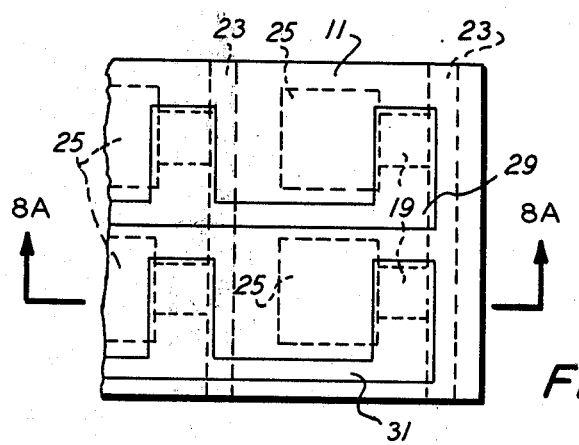
Figure 8A:
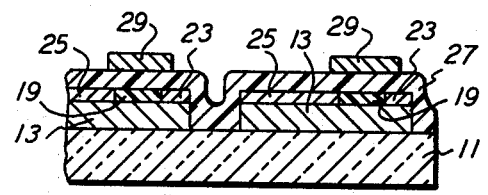

The structure of a portion of a thin film transistor array in accordance with this invention is shown in FIGS. 8 and 8A. As indicated above, the structure of the array may be modified by disposing the semiconductive layer 13 on top of insulating layer 15 which itself may lie either adjacent either a conductive layer 17 or the substrate 11. In any event, the semiconductor material 13 in the completed array is coterminous with the source electrodes, source bus conductors and the drain electrodes. That is, the semiconductive material 13 is in physical and electrical contact with the conductive material forming the source electrodes and source bus conductors 23 and the drain electrodes 25 in all areas except in the areas which form the conductive channel of each transistor, this area being that portion of the semiconductor material 13 lying immediately beneath the insulating pads 19. Thus, all of the source electrodes 23 in any column are electrically connected together since each source electrode forms a portion of the source bus conductor. By electrically addressing any given column source bus conductor 23 and any given row gate bus conductor, a single transistor of the array can be turned on, thereby permitting current to flow from its source through the conductive channel of the semiconductive material to the corresponding drain. This then can be utilized to alter the field across an electro-optical device, such as a liquid crystal layer, thus providing an optical read-out of a bit of information.

Although the invention has been described in considerable detail in the foregoing, it is to be understood that such detail is solely for the purpose of illustration and that many variations in the thin film transistor arrays and the process described herein can be made by those skilled in the art without departing from the spirit and scope of the invention except as set forth in the claims.

What is claimed is:

1. A method of preparing an array of thin film transistors which comprises, in vacuo, depositing onto a substrate a uniform layer of a semi-conducting material, depositing onto said semiconducting layer through a shadow mask, a plurality of discrete areas of an insulating material, depositing a uniform layer of a conducting material over the areas of insulating material and exposed portions of the semiconducting layer, removing the substrate containing the deposited layers from the vacuum, photolithographically forming a masking layer on said uniform layer of conducting material having a predetermined pattern of openings therein, removing the portions of the conducting material unprotected by the masking layer to thereby form the source, drain and source bus conductors of the array, removing the semiconducting material exposed by removal of the conducting material, removing the masking layer, depositing a uniform layer of insulating material over the thus-formed structure, and depositing in discrete areas a pattern of conductive material to form the gate and gate bus conductors of the array.

2. The method of claim 1 wherein in vacuo, prior to the deposition of the uniform layer semiconducting material onto the substrate, the substrate is subject to a treating step to provide a new surface.

3. The method of claim 2 wherein the surface of the substrate is subjected to ion milling.

4. The method of claim 2 wherein the surface of the substrate is plasma etched.

5. The method of claim 1 wherein in vacuo, prior to the deposition of the uniform layer of semiconducting material onto the substrate, a uniform layer of an insulating material is deposited onto the substrate.

6. The method of claim 1 wherein in vacuo, prior to the deposition of the uniform layer of semiconducting material onto the substrate, a uniform layer of a conductive material is deposited onto the substrate and a uniform layer of an insulating material is deposited on the conductive material.

* * * * *